United States Patent [19]
Motoda et al.

[11] Patent Number: 5,762,708
[45] Date of Patent: Jun. 9, 1998

[54] COATING APPARATUS THEREFOR

[75] Inventors: Kimio Motoda; Kiyohisa Tateyama, both of Kumamoto, Japan

[73] Assignee: Tokyo Electron Limited, Japan

[21] Appl. No.: 525,342

[22] Filed: Sep. 7, 1995

[30] Foreign Application Priority Data

Sep. 9, 1994 [JP] Japan .................... 6-242227

[51] Int. Cl.$^6$ .................... B05C 11/02; B08B 3/00
[52] U.S. Cl. .................... 118/52; 118/319; 118/320; 134/902; 134/200; 134/153
[58] Field of Search .................... 118/52, 54, 319, 118/320, 302; 222/108, 148, 420–422; 239/106, 112, 113; 134/902, 200, 151, 149, 153; 141/89–91

[56] References Cited

U.S. PATENT DOCUMENTS

| | | | |
|---|---|---|---|
| 4,075,974 | 2/1978 | Plows et al. | 118/320 |
| 4,941,426 | 7/1990 | Sago et al. | 118/52 |
| 5,211,753 | 5/1993 | Swain | 118/52 |
| 5,261,566 | 11/1993 | Nakayama | 118/52 |
| 5,439,519 | 8/1995 | Sago et al. | 118/52 |

FOREIGN PATENT DOCUMENTS 63-24871  10/1988  Japan .
5-160017   6/1993  Japan .

*Primary Examiner*—Donald E. Czaja
*Assistant Examiner*—Calvin Padgett
*Attorney, Agent, or Firm*—Graham & James LLP

[57] ABSTRACT

A coating apparatus comprises a rotary container rotatable about a rotational axis as the center, a rotary rest table, located in the rotary container to be movable vertically and rotatable about the rotational axis as the center, for supporting a target substrate thereon, coating solution supply pipe for applying a coating solution to the target substrate, cleaning solution supply pipe for spraying a cleaning solution to an inner surface of the rotary container, a seal member provided between the rotary rest table and the bottom wall of the rotary container and capable of sealing a gap between the rotary rest table and the bottom wall of the rotary container, and connecting mechanism for connecting the rotary container and the rotary rest table so as to rotate together. The cleaning solution supply pipe projects from a through hole formed in the upper portion of the rotary container to be coaxial with the rotational axis, and the coating solution supply pipe projects from the through hole of the rotary container to be coaxial with the rotational axis.

14 Claims, 4 Drawing Sheets

COATING APPARATUS THEREFOR

BACKGROUND OF THE INVENTION

1. Field of the Invention

The present invention relates to a coating apparatus for applying a coating solution to a rotating target substrate, and a method therefor.

2. Description of the Related Art

In general, in the manufacturing process of a liquid crystal display (LCD) device, an ITO (Indium Tin Oxide) thin film, an electrode pattern, and the like are formed on an LCD substrate (glass substrate). For this formation, a series of processing operations are performed in which the circuit pattern and the like are reduced and transferred on a photoresist by using a photolithography technique similar to that used in the semiconductor manufacturing process, and the transferred circuit pattern and the like are developed.

For example, after a rectangular LCD substrate as the target substrate is cleaned by a cleaning unit, the LCD substrate is subjected to a hydrophobic process by an adhering unit, and is cooled by a cooling unit. Then, a photoresist film, i.e., a photosensitive film, is formed on the LCD substrate by coating with a resist coating apparatus. The photoresist is baked by heating with a heating unit, and a predetermined pattern is exposed by an exposure unit. A developing solution is applied to the exposed LCD substrate, and the LCD substrate is developed by a developing unit, and the developing solution is washed out with a rinsing solution, thus completing the developing operation.

This resist coating is generally performed in accordance with the spin coating scheme by using a coating apparatus disclosed in, e.g., Jpn. Pat. Appln. KOKAI Publication No. 63-248471.

A cleaning solution supply pipe extends through the fixing collar from the outside, and a cleaning solution nozzle at the distal end of the cleaning solution supply pipe is located below the spin chuck. If the resist solution is left attaching to the inner wall of the rotary cup, part of the resist solution is removed to undesirably form particles. Therefore, for example, every time one cassette is processed, the spin chuck is moved upward, the cleaning solution nozzle is located between the spin chuck and the bottom surface of the rotary cup, and the spin chuck and the rotary cup are rotated while spraying a cleaning solution, e.g., thinner, thereby cleaning the inner surface of the rotary cup.

However, the coating apparatus described above has problems as follows.

(1) The fixing collar is interposed for the purpose of extending the cleaning solution supply pipe from the outside of the rotation mechanism. The inner rotary cylinder serving as the rotating shaft of the spin chuck and the outer rotary cylinder serving as the rotating shaft of the rotary cup are provided on the two sides of the fixing collar, and the spin chuck and the rotary cup are rotated by the separate driven pulleys. Thus, during acceleration or deceleration, the rotational speeds of the spin chuck and rotary cup differ often. More specifically, as a rotary cup generally has a large weight, a belt used for rotating this cup tends to be stretched. As a result, rotation of the pulleys cannot accurately catch up with rotation of this belt during acceleration, and the rotational speed of the pulleys becomes higher than the traveling speed of the belt due to the inertia force during deceleration. For this reason, a relative rotation occurs between the spin chuck and the bottom surface of the rotary cup to rub the seal member. Then, the seal member undesirably forms particles.

(2) As the inner and outer rotary cylinders are respectively provided to the inner and outer sides of the fixing collar, the mechanism of the rotating shaft forms a double structure which is complicated.

SUMMARY OF THE INVENTION

It is an object of the present invention to provide a coating apparatus which has a simple structure and in which a seal member between the rotary rest table and the rotary container will not be rubbed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

Figure 1:
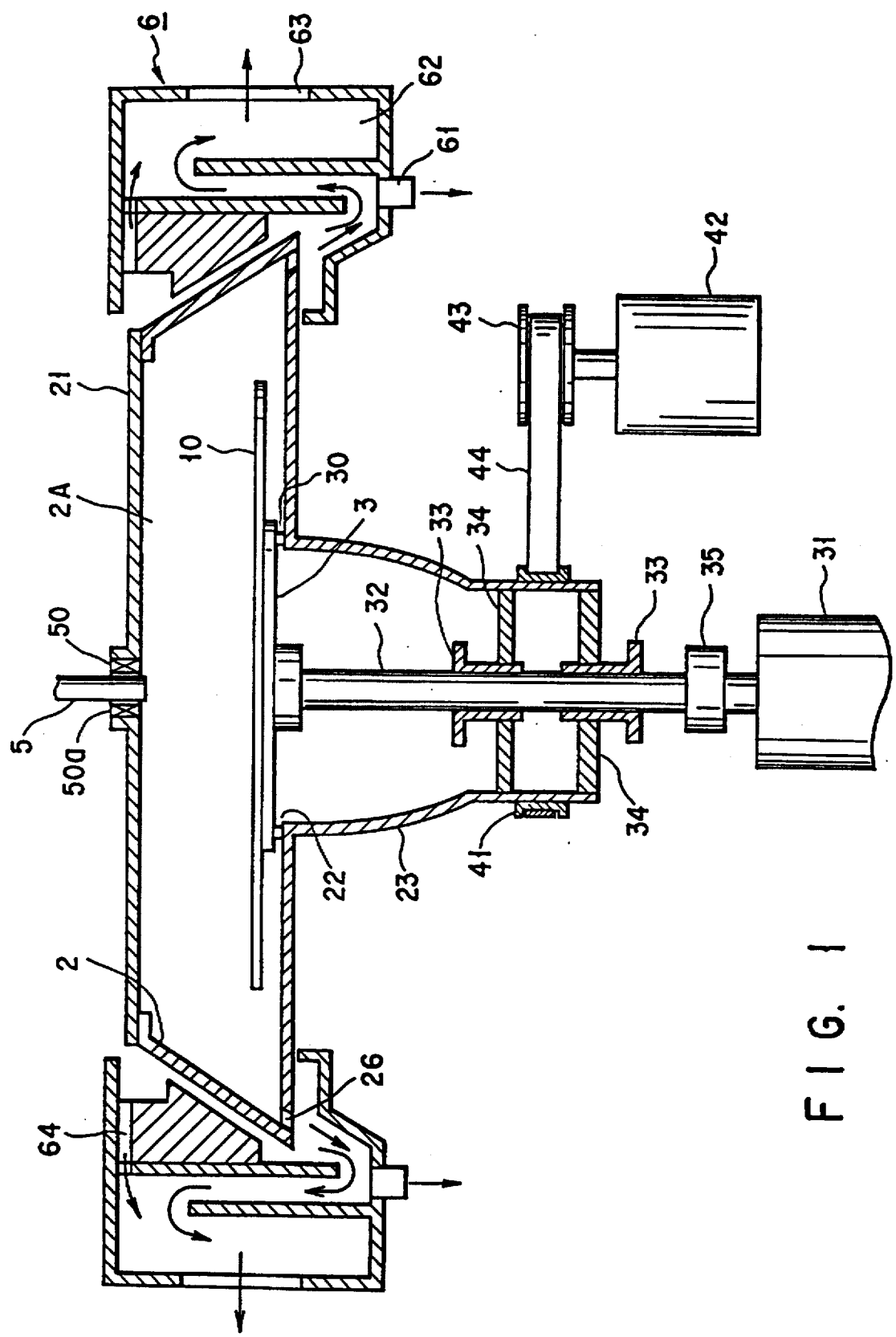
FIG. 1 is a sectional view schematically showing the overall arrangement of a coating apparatus according to an embodiment of the present invention.

FIG. 1 shows a coating apparatus according to an embodiment of the present invention, in which reference numeral 2 denotes a rotary cup having an open upper wall and rotatable about a vertical or rotational axis as the center. A lid body 21 is attached to the upper wall of the rotary cup 2 to open and close the opening portion 2A. A circular opening portion 22 is formed in the central portion of the bottom wall of the rotary cup 2, and the upper edge of a rotary cylinder 23 for rotating the rotary cup 2 is connected to the open edge of the opening portion 22. These rotary cup 2 and lid body 21 constitute a rotary container.

A rotary rest table, e.g., a spin chuck 3, which is rotatable about the vertical axis as the center is, horizontally arranged in the rotary cup 2. An annular seal member 30, e.g., an o-ring, is attached on the bottom wall of the rotary cup between the lower surface of the circumferential edge portion of the spin chuck 3 and the circumferential edge of the opening portion 22 in the bottom wall of the rotary cup 2 to be able to seal the gap between them, thereby preventing a liquid flow from the interior of the rotary cup 2 to the opening portion 22. This seal member 30 is preferably made of an elastic body, e.g., a synthetic rubber such as a fluorine-based rubber. The spin chuck 3 is mounted on the top portion of an elevating or rotating shaft 32 which is moved vertically by an elevating mechanism 31 comprising, e.g., an air cylinder, along the vertical axis. A pair of spline bearings 33 are mounted on the outer circumferential surface of an intermediate portion of the elevating shaft 32 to be slightly spaced apart from each other in the axial direction. The outer circumferential surfaces of the spline bearings 33 are mounted on the inner circumferential surface of an intermediate ring 34 such that they are movable independently and rotatable integrally in the axial direction against the ring 34. The outer circumferential surface of the intermediate ring 34 is fixed on the inner circumferential surface of the lower portion of the rotary cylinder 23. As a result, the spline bearings 33 and the rotary cylinder 23 are integrally rotated through the intermediate ring 34. The intermediate ring 34 is rotatably mounted on the apparatus main body with a constituent member comprising a bearing and the like (not shown).

A driven pulley 41 is coaxially fixed to the outer circumferential surface of the lower portion of the rotary cylinder 23, and an endless belt 44 is looped between the driven pulley 41 and a driving pulley 43 which is coaxially fixed to the rotating shaft of a spin motor 42.

With this arrangement, the rotary cylinder 23 and the elevating shaft 32 are integrally rotated by the spin motor 42, and the elevating shaft 32 can be vertically moved together with the spline bearings 33 with respect to the rotary cylinder 23 by the elevating mechanism 31.

The spin chuck 3 has a vacuum chuck on its upper surface portion, so that it can chuck by suction a target substrate 10, e.g., an LCD substrate (a glass substrate for a liquid crystal display), on its upper surface. A vacuum passage (not shown) formed in the elevating shaft 32 is connected to an external vacuum line (not shown) through a vacuum seal portion 35 of the elevating shaft 32.

A tubular body 5 for supplying a resist solution serving as a coating solution and a cleaning solution is inserted in a central opening formed in the central portion of the lid body 21, such that its distal end projects into the rotary cup 2. A bearing 50 is interposed between the outer circumferential surface of the tubular body 5 and the inner surface of the central opening, and the tubular body 5 is arranged to be coaxial with the elevating shaft 32. As a result, the tubular body 5 is not rotated by rotation of the rotary cup 2 but maintains a stationary state. Because of this stationary state, the tubular body 5 is preferably mounted on the apparatus main body with a support means (not shown) to be movable in the axial direction. The tubular body 5 is detachably inserted in a mounting cylindrical portion 50a located inside the bearing 50.

Figure 2:
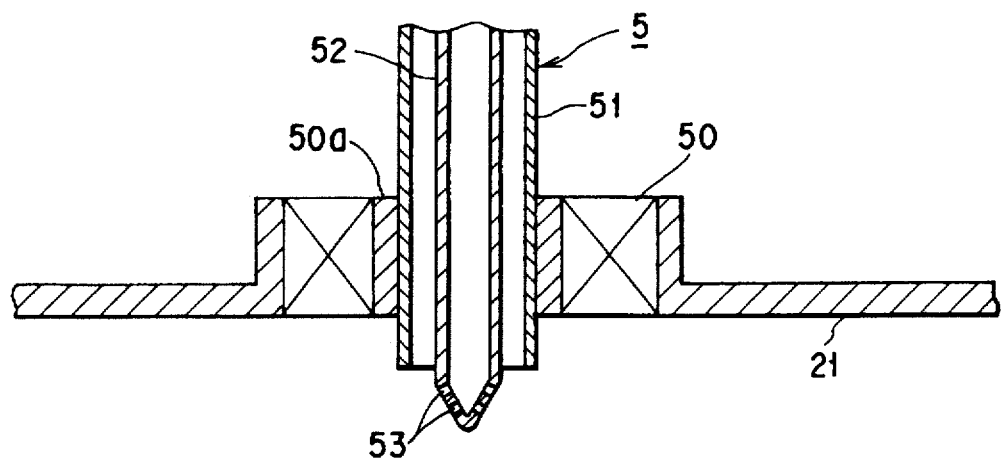
FIG. 2 is a partial enlarged sectional view of the coating apparatus shown in FIG. 1.

As shown in FIG. 2, the tubular body 5 has a double-pipe structure consisting of a cylindrical outer pipe 51 and a cylindrical inner pipe 52. The annular space between the outer and inner pipes 51 and 52 is connected to a resist solution reservoir (not shown) at its proximal end portion, thus constituting a resist solution supply path. The inner pipe 52 is connected to a cleaning solution, e.g., thinner, reservoir (not shown) at its proximal end portion to constitute a cleaning solution supply path therein. The distal end surface of the outer pipe 51 is horizontally flat, and the distal end portion of the inner pipe 52 extends from the outer pipe 51 to form a circular conical nozzle serving a cleaning solution supply portion. A plurality of spray holes 53 are formed in the circumferential wall of this nozzle. Thus, this nozzle can spray the cleaning solution toward the side-circumferential inner surface of the rotary cup 2 from its upper to lower portion.

The lid body 21 is mounted to the distal end of an arm 25 vertically moved by an elevating portion 24 (shown in FIG. 3) provided to the apparatus main body. When the arm 25 is moved upward/downward, the upper opening portion 2A is opened/closed with the lid body 21. A portion midway along the tubular body 5 is mounted to, e.g., the arm 25. A convey arm 100 is separately provided for loading/unloading the target substrate 10. To transfer the target substrate 10 between the spin chuck 3 and the target substrate convey arm 100, the lid body 21 is moved upward to open the upper opening portion 2A, the spin chuck 3 is moved upward by the elevating mechanism 31 above the upper surface of the rotary cup 2, and the convey arm 100 is moved forward toward the spin chuck 3 at a level lower than the lower surface of the target substrate 10 which is chucked by the spin chuck 3.

A drain cup 6 is fixed to a fixing portion (not shown) to surround the outer circumferential surface of the rotary cup 2 as shown in FIG. 1. The drain cup 6 has a plurality of drain holes 61, an annular air discharge path 62, air discharge ports 63, and a plurality of air suction paths 64. The drain holes 61 downwardly discharge the discharge solution discharged through a plurality of solution discharge holes 26 that are formed in the outer edge portion of the bottom portion of the rotary cup 2 to be equidistant in the circumferential direction. The air discharge path 62 forms a passage bent in the radial direction. The air discharge ports 63 communicate with the air discharge path 62, are formed at, e.g., four portions, in the circumferential direction, and are connected to an evacuation unit (not shown) communicating with the air discharge path 62. The air suction paths 64 are radially formed in the upper portion of the drain cup body.

The operation of this apparatus will be described.

Figure 3:
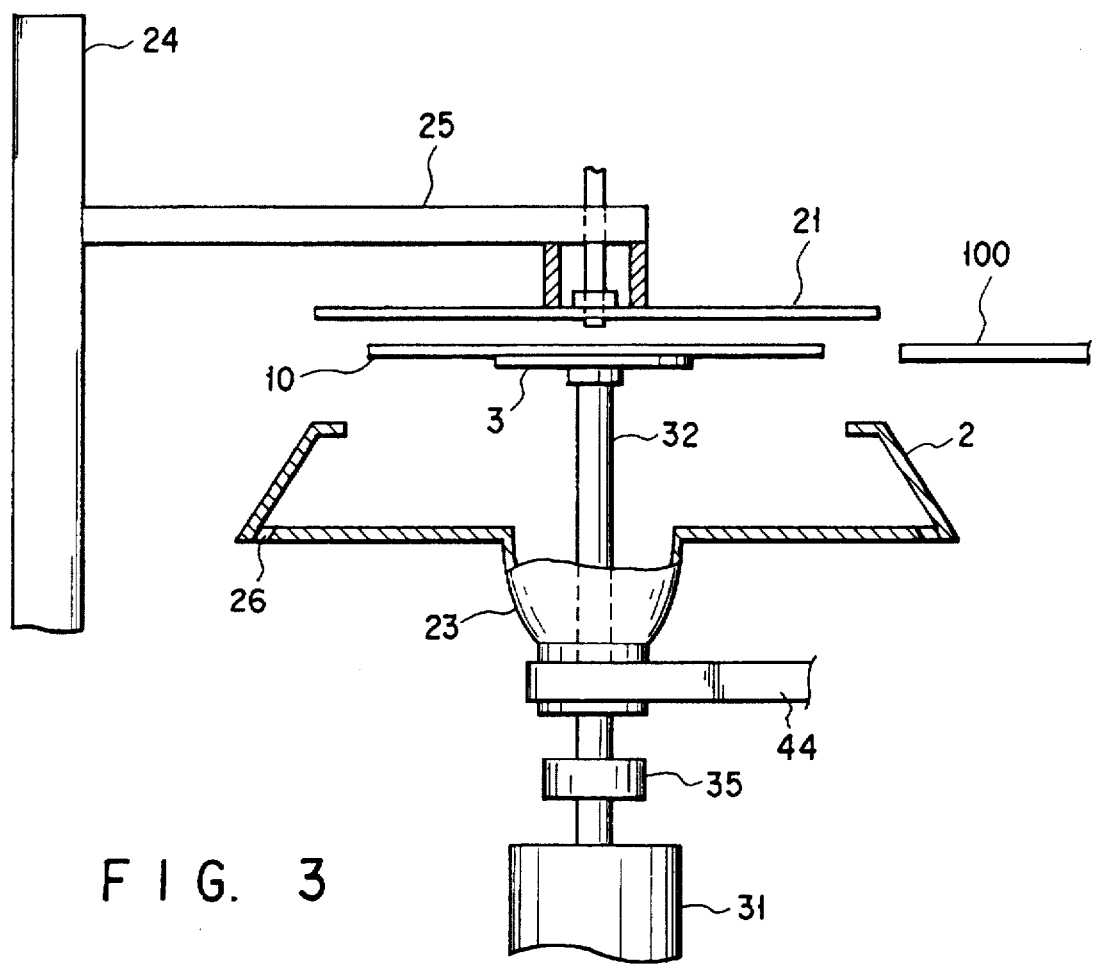
FIG. 3 is a diagram for explaining the opening/closing operation of the lid body of the coating apparatus shown in FIG. 1 and the transfer operation of a target object.
Figure 4A:
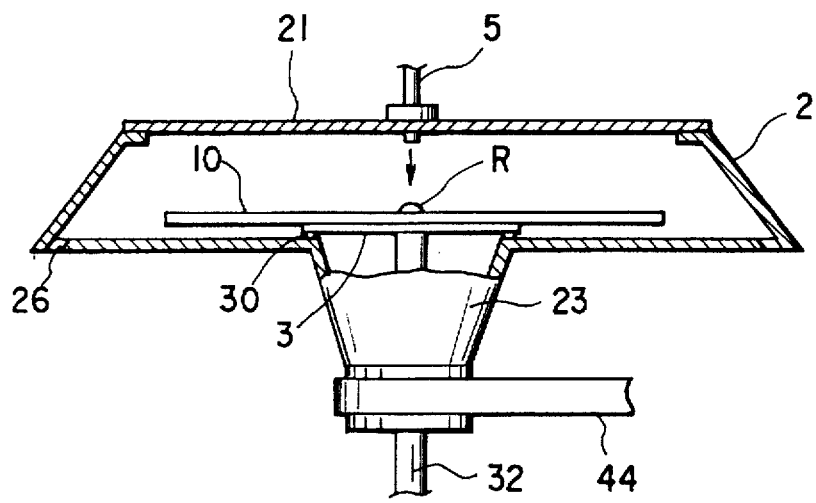
FIGS. 4A and 4B are diagrams showing the operation of the coating apparatus shown in FIG. 1.

First, the lid body 21 is moved upward from the rotary cup 2 to be kept open, as shown in FIG. 3. The spin chuck 3 is moved upward, and a target substrate 10, e.g., an LCD substrate, is transferred from the convey arm 100 to the spin chuck 3 and is drawn by vacuum by the spin chuck 3. Subsequently, the spin chuck 3 is moved downward to be brought into tight contact with the bottom portion of the rotary cup 2 through the seal member 30, thereby sealing the gap between the inner space of the rotary cylinder 23 and the inner surface of the rotary cup 2. As shown in FIG. 4A, a predetermined amount of resist solution R serving as the coating solution is dropped from the tubular body 5 above the target substrate 10 onto the central portion of the target substrate 10 as indicated by an arrow.

Subsequently, the spin motor 42 (see FIG. 1) is driven to rotate the rotary cylinder 23 with the endless belt 44. Since this rotation is transmitted to the elevating shaft 32 through the intermediate ring 34 and spline bearings 33, the elevating shaft 32 is also rotated. Accordingly, the rotary cup 2 and the spin chuck 3 are rotated in synchronism with each other at the same rotation speed, so that the resist solution on target substrate 10 is diffused by the centrifugal force to coat the surface of the target substrate 10, thereby forming a resist layer as a coating film having a predetermined thickness.

Figure 4B:
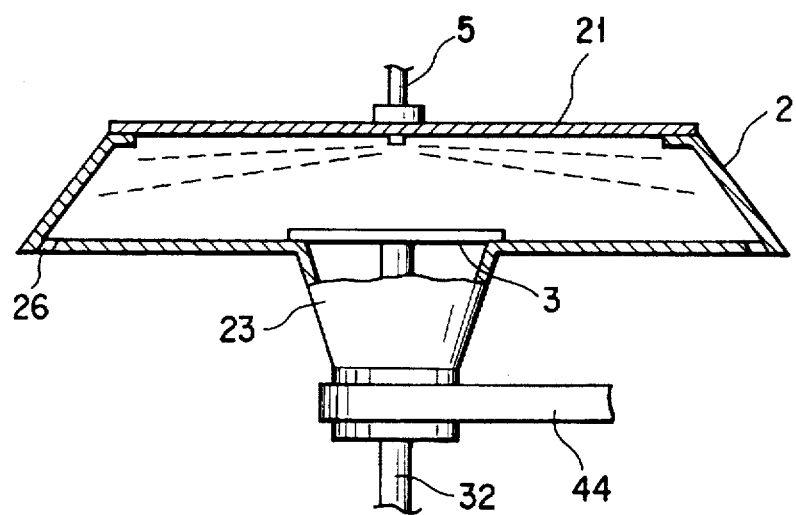

Thereafter, rotation of the rotary cup 2 (spin chuck 3) is stopped, the lid body 21 is opened, the spin chuck 3 is moved upward to transfer the target substrate 10 to the convey arm 100 (see FIG. 3), and thereafter a new target substrate 10 is conveyed to the spin chuck 3. When the coating operation for a predetermined number of target substrates, e.g., 25 target substrates corresponding to one cassette, is completed in this manner, the interior of the rotary cup 2 is cleaned. This cleaning process is performed by rotating the rotary cup 2 together with the spin chuck 3 while spraying the cleaning solution, passing through the inner pipe 52 of the tubular body 5, from the spray holes 53, as shown in FIG. 4B. More specifically, the cleaning solution, e.g., thinner, is sprayed from the spray holes 53 toward the inner surface of the rotary cup 2 which is rotating, as indicated by broken lines in FIG. 4B. As the spray holes 53 are set such that the cleaning solution is sprayed toward the inner surface of the rotary cup 2 from its upper to lower edge, the entire portion of the inner surface of the rotary cup 2 is wet with the cleaning solution. Then, the resist, which is scattered during spin coating to adhere to the inner surface of the rotary cup 2 and is then solidified, is dissolved by the cleaning solution, runs down along the inner surface of the rotary cup 2, and is discharged to the outside through the solution discharge holes 26 and the drain holes 61 of the drain cup 6.

When the cleaning solution supply portion (in this case, the nozzle at the distal end portion of the inner pipe 52 of the tubular body 5) is provided to the lid body 21 in this manner, a fixing portion for arranging the tubular cleaning body below the rotary cup 2 is unnecessary. Thus, the rotating shafts of the rotary cup 2 and spin chuck 3 need not be separated to interpose a fixing collar between them, but can be integrally formed. The structure concerning the rotating shaft can be simplified, and one rotating shaft can be used in common regardless of the difference in weight between the rotary cup 2 and spin chuck 3, i.e., regardless of the difference in inertia moment, so that the rotary cup 2 and the spin chuck 3 can be rotated by the common endless belt 44 at the same constant speed. Thus, the seal member 30 sealing the gap between the rotary cup 2 and spin chuck 3 will not be rubbed to form particles.

In the apparatus of the present invention, regarding the cleaning solution supply pipe and the coating solution supply pipe, the latter may be arranged in the former. The cleaning solution supply portion and the coating solution supply portion may be provided separately. For example, the cleaning solution supply pipe and the coating solution supply pipe may not be arranged concentrically but be arranged side by side. The distal end portion of the coating solution supply pipe may be branched to form a plurality of nozzles having different spray directions. Regarding the cleaning timing of the rotary cup 2, the cleaning operation is not limited to be performed every time a coating operation for one cassette is ended, but may be performed, e.g., after a coating operation for a plurality of cassettes is ended, or every time one target substrate is coated.

In the present invention, it is preferable that the inner surface of the rotary cup 2 be wet, preferably entirely, with the cleaning solution before the coating operation is performed. Then, even if the resist solution attaches to the inner surface of the rotary cup 2 during coating, it is dissolved by the cleaning solution and runs down. Thus, the amount of hardened resist solution is decreased, so that particles formed by separation of the fixed resist solution become less, and the frequency of the cleaning operation can be decreased. In this case, if a cleaning solution supply portion is provided to the lid body 21 as in the above embodiment, the step of wetting the inner surface of the rotary cup 2 with the cleaning solution and the coating step can be continuously performed while the spin chuck 3 is left at the position to be in tight contact with the bottom surface of the rotary cup 2. Thus, a time caused by adopting the cleaning solution wetting step is very short, thus preventing a decrease in throughput. The cleaning solution wetting step may be performed every time one target substrate is coated, or may be performed after a plurality of target substrates are coated.

The cleaning solution for wetting may be supplied while rotating the rotary cup 2 or before rotating the rotary cup 2.

Figure 5:
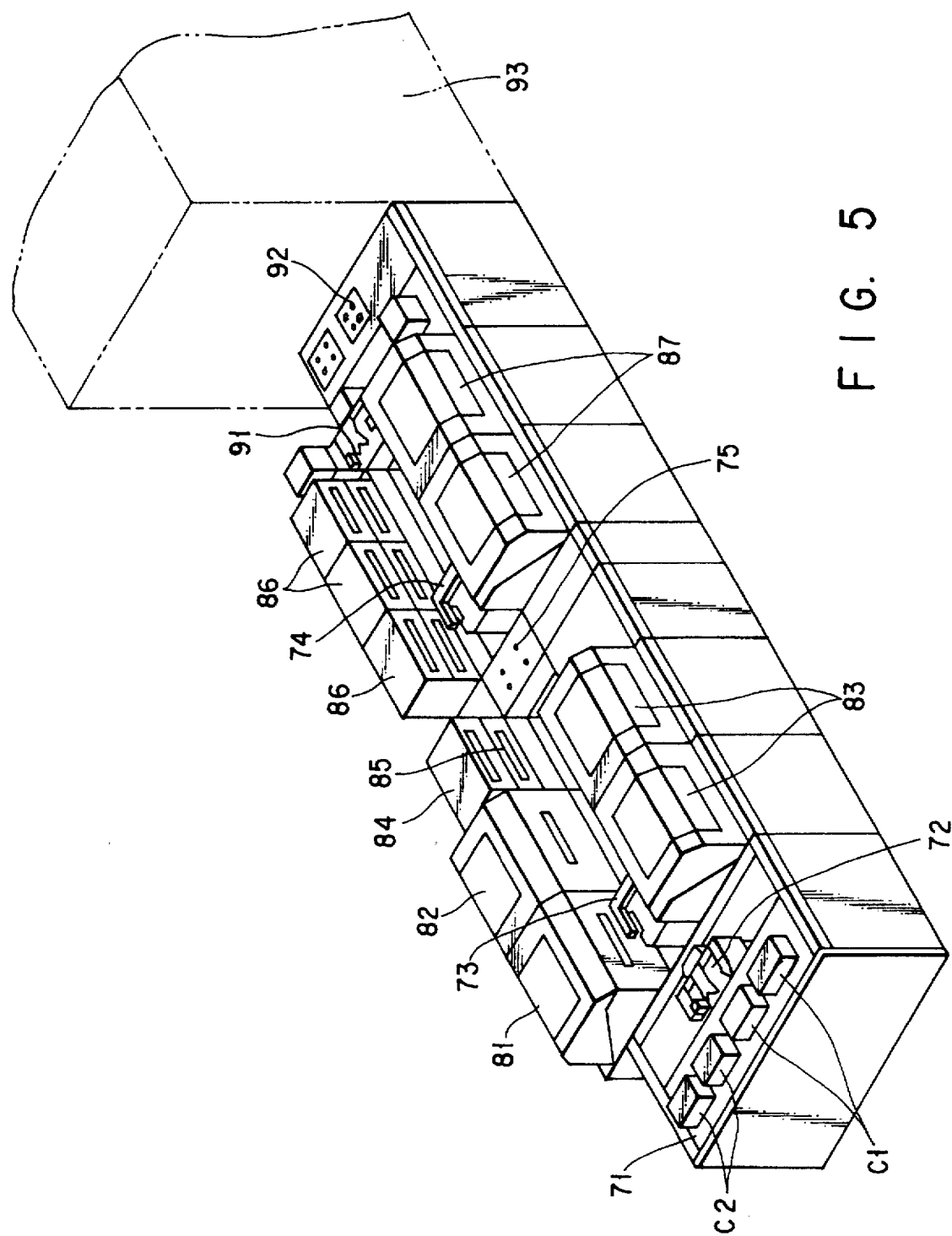
FIG. 5 is a schematic perspective view showing a coating/developing system incorporating the coating apparatus of the present invention.

The above coating apparatus can be used as a stand-alone apparatus, or incorporated in, e.g., an LCD substrate coating/developing system shown in FIG. 5. Referring to FIG. 5, reference numeral 71 denotes a carrier stage. Carriers C1 each storing a plurality of unprocessed substrates and carriers C2 each storing processed substrates are placed on the carrier stage 71. Reference numeral 72 denotes loading/unloading tweezers; 73 and 74, main arms for conveying substrates; and 75, a transfer table.

A brush cleaning section 81, a jet water cleaning section 82, coating apparatuses 83 according to the present invention, an adhering section 84, and a cooling section 85 are provided on the two sides of the main arm 73, and heating sections 86 and developing sections 87 are provided on the two sides of the main arm 74. An exposure unit 93 is coupled to the right-side end portion of the coating/developing system through loading/unloading tweezers 91 and transfer tables 92.

In the coating/developing system having the above arrangement, an unprocessed substrate stored in the carrier C1 is extracted by the loading/unloading tweezers 72, transferred to the main arm 73, and conveyed into the brush cleaning section 81. The substrate brush-cleaned in the brush cleaning section 81 is successively cleaned with high-pressure jet water in the jet water cleaning section 82 as required. Thereafter, this substrate is subjected to the hydrophobic process by the adhering section 84 and cooled by the cooling section 85. Then, a photoresist film, i.e., a photosensitive film, is formed on this substrate by coating with the coating apparatus 83. The photoresist is pre-baked by heating by the heating sections 86, and a predetermined pattern on the substrate is exposed by the exposure unit 93. The substrate after exposure is conveyed into the developing section 87. The substrate is subjected to development with a developing solution, and thereafter the developing solution is rinsed off with the rinsing solution, thus completing development.

In the coating/developing system described above, ultraviolet irradiating mechanisms (not shown) may be provided in place of the cooling section 85 and the heating sections 86, and a foreign matter, e.g., an organic substance, attaching to the substrate may be removed through oxidation by irradiating ultraviolet rays to the substrate. Ultraviolet irradiation is performed before, after, or during each processing operation, or is performed continuously.

If an organic substance attaches to the surface of a cooled substrate, this causes, for example, nonuniform coating in the subsequent coating step, thus interfering with uniform coating. If an organic substance attaches to the surface of a pre-baked substrate, this causes nonuniform exposure in the subsequent exposure step, thus causing a resist pattern defect after development. If the foreign matter is removed by ultraviolet irradiation, these inconveniences can be eliminated.

In the apparatus of the present invention, since the cleaning solution supply means is provided to the upper wall portion of the rotary container, when the rotary container and the rotary rest table are to be rotated in synchronism with each other, a fixing portion for passing the cleaning solution supply means therethrough becomes unnecessary, thereby simplifying a structure for rotation. When the rotary container and the rotary rest table are brought into tight contact with each other and are to be rotated at the same speed, since a common rotating shaft can be used for this rotation, the seal portion between the rotary container and the rotary rest table will not be rubbed to form particles. According to the method of the present invention, as the inner surface of the rotary container is wet with the cleaning solution in advance, the amount of hardened coating solution is decreased, so that, e.g., the frequency of the cleaning operation can be decreased. In this case, if the apparatus of the present invention is employed, the cleaning time caused by employing the cleaning solution wetting step can be shortened.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A coating apparatus comprising:

a rotary container having an upper opening provided at an upper portion of the rotary container, a lower opening provided at a bottom portion of the rotary container and a lid body for opening or closing the upper opening, said rotary container being rotatable about a rotational axis as the center of the rotary container;

a rotary rest table, located in said rotary container, being movable vertically with respect to said rotary container between a target substrate receiving position above the upper opening when the lid body is opened and a coating solution application position within said rotary container when the lid body is closed and being rotatable about the rotational axis as the center, for supporting the target substrate in said rotary container;

coating solution application means, coupled to said rotary container, for applying a coating solution to the target substrate supported on said rotary rest table positioned in the coating solution application position;

cleaning solution application means, coupled to said rotary container, for spraying a cleaning solution to an inner surface of said rotary container;

rotating means, coupled to said rotary container, for rotating said rotary container;

connecting means, coupled to said rotary container and said rotary rest table, for connecting said rotary container and said rotary rest table so that said rotary container and said rotary rest table integrally rotate when said rotary container is rotated by said rotating means; and a seal member provided between said rotary rest table and said bottom portion of said rotary container to surround the lower opening, and being capable of sealing a gap between said rotary rest table positioned in sealing solution application position and said bottom portion of said rotary container.

2. An apparatus according to claim 1, wherein said cleaning solution application means is mounted on said lid body to be rotatable relative to said rotary container.

3. An apparatus according to claim 2, wherein said lid body has a through hole coaxial with the rotational axis, said cleaning solution application means has a cleaning solution application pipe projecting from the through hole in said lid body into said rotary container to be coaxial with the rotational axis, and said coating solution application means has a coating solution application pipe projecting from the through hole of said lid body into said rotary container to be coaxial with the rotational axis.

4. An apparatus according to claim 3, wherein said cleaning solution application pipe and said coating solution application pipe are arranged such that one application pipe is coaxially arranged in the other application pipe at a gap.

5. An apparatus according to claim 4, wherein said cleaning solution application pipe is coaxially arranged in said coating solution application pipe at a gap, and the gap defines a coating solution application path.

6. An apparatus according to claim 5, wherein said cleaning solution application pipe has a nozzle portion extending downward from said coating solution application pipe, and a plurality of spray holes formed in said nozzle portion.

7. An apparatus according to claim 6, wherein said nozzle portion has a circular conical pipe narrowed downward, and the spray holes are form in a side surface of said circular conical pipe.

8. An apparatus according to claim 1, wherein said connecting means has an elevating/rotating shaft supporting said rotary rest table at an upper end thereof and extending along the rotational axis, a rotary cylinder having an upper end connected to said bottom portion of said rotary container near the lower opening of said rotary container and extending coaxially with said rotating shaft to surround said rotating shaft, and a connecting mechanism, provided between said rotary cylinder and said rotating shaft, for connecting said rotary cylinder and said rotating shaft such that said rotary cylinder and said rotating shaft can be rotated together and vertically moved relative to each other.

9. An apparatus according to claim 8, wherein said rotating means has a motor and means, coupled to said motor and said rotary cylinder, for transmitting rotation of said motor to said rotary cylinder.

10. An apparatus according to claim 9, wherein said connection mechanism includes a pair of spline bearing mounted on an outer circumferential surface of the rotating shaft along the rotation axis, and a pair of intermediate rings, each having an outer end fixed on an inner circumferential surface of the rotary cylinder and an inner end engaged with the spline bearing so that the spline bearing is vertically moved against the intermediate ring and rotated therewith.

11. An apparatus according to claim 1, wherein said coating solution application means includes a nozzle having an opening to face the inner surface of said rotary container, so that the cleaning solution is radially sprayed from the opening of the nozzle toward the inner surface of said rotary container.

12. An apparatus according to claim 1, wherein the seal member is made of an elastic material.

13. An apparatus according to claim 12, wherein the elastic material is synthetic rubber.

14. An apparatus according to claim 13, wherein the synthetic rubber is fluorine based.

* * * * *